(12) United States Patent
Tsuchiya et al.

(10) Patent No.: US 11,889,668 B2
(45) Date of Patent: Jan. 30, 2024

(54) ELECTRONIC DEVICE

(71) Applicant: KABUSHIKI KAISHA TOYOTA JIDOSHOKKI, Kariya (JP)

(72) Inventors: Ryoto Tsuchiya, Kariya (JP); Masayoshi Kobayashi, Kariya (JP); Tatsuya Goto, Kariya (JP); Kazuji Yamazaki, Kariya (JP)

(73) Assignee: KABUSHIKI KAISHA TOYOTA JIDOSHOKKI, Kariya (JP)

( * ) Notice: Subject to any disclaimer, the term of this patent is extended or adjusted under 35 U.S.C. 154(b) by 399 days.

(21) Appl. No.: 17/417,554

(22) PCT Filed: Dec. 19, 2019

(86) PCT No.: PCT/JP2019/049937
§ 371 (c)(1),
(2) Date: Jun. 23, 2021

(87) PCT Pub. No.: WO2020/137834
PCT Pub. Date: Jul. 2, 2020

(65) Prior Publication Data
US 2022/0061193 A1  Feb. 24, 2022

(30) Foreign Application Priority Data

Dec. 27, 2018 (JP) .................. 2018-245845

(51) Int. Cl.
*H05K 7/20* (2006.01)
*H02M 3/00* (2006.01)
*G01K 1/14* (2021.01)

(52) U.S. Cl.
CPC .......... *H05K 7/20945* (2013.01); *G01K 1/14* (2013.01); *H02M 3/003* (2021.05); *H05K 7/209* (2013.01)

(58) Field of Classification Search
None
See application file for complete search history.

(56) References Cited

U.S. PATENT DOCUMENTS

| | | | |
|---|---|---|---|
| 6,293,700 B1 * | 9/2001 | Lund ..................... | G01K 7/13 374/182 |
| 7,007,506 B2 * | 3/2006 | Kubo ................. | H05K 7/20309 165/170 |
| 7,230,419 B2 * | 6/2007 | Godoy ................... | G01D 5/145 324/207.2 |
| 7,463,485 B1 * | 12/2008 | Nishimura ......... | H05K 7/20854 361/689 |

(Continued)

FOREIGN PATENT DOCUMENTS

| | | |
|---|---|---|
| CN | 108645525 A | 10/2018 |
| JP | 2008-196936 A | 8/2008 |
| JP | 2015-35408 A | 2/2015 |

*Primary Examiner* — Courtney L Smith
(74) *Attorney, Agent, or Firm* — Sughrue Mion, PLLC

(57) ABSTRACT

A DC/DC converter includes a metal case, a power converter accommodated in the case, a substrate, and a temperature sensor mounted on a surface of the substrate. The case includes a bottom wall, a side wall extending from the bottom wall, a boss, and a coupling portion. The coupling portion couples the side wall to the boss. The coupling portion extends from the bottom wall along an axis of the boss and along a surface of the side wall. The temperature sensor is arranged to face the coupling portion.

5 Claims, 2 Drawing Sheets

(56) References Cited

U.S. PATENT DOCUMENTS

| | | | | |
|---|---|---|---|---|
| 8,477,502 B2 * | 7/2013 | Single | ................... | B25F 5/008 |
| | | | | 361/720 |
| 9,474,189 B2 * | 10/2016 | Kawauchi | .......... | H05K 7/20436 |
| 9,974,180 B2 * | 5/2018 | Malek | ................... | H05K 1/181 |
| 2006/0019510 A1 * | 1/2006 | Rudduck | ................ | H05K 7/142 |
| | | | | 439/74 |
| 2012/0300179 A1 * | 11/2012 | Masuda | ............... | G03B 21/145 |
| | | | | 362/249.02 |
| 2013/0120915 A1 * | 5/2013 | Eichner | ............. | H05K 7/20854 |
| | | | | 361/679.01 |

* cited by examiner

US 11,889,668 B2

ELECTRONIC DEVICE

CROSS REFERENCE TO RELATED APPLICATIONS

This application is a National Stage of International Application No. PCT/JP2019/049937 filed Dec. 19, 2019, claiming priority based on Japanese Patent Application No. 2018-245845 filed Dec. 27, 2018.

TECHNICAL FIELD

The present invention relates to an electronic device.

BACKGROUND ART

In an electronic device including a case, a heating element accommodated in the case is cooled by cooling the case using a cooling medium. The electronic device includes a temperature sensor that monitors the temperature of the cooling medium. The temperature sensor measures the temperature of the case. The temperature of the case and the temperature of the cooling medium correlate with each other. Thus, the temperature of the cooling medium can be indirectly monitored by measuring the temperature of the case. When a temperature sensor mounted on the surface of a substrate is used, the accuracy of measuring the temperature of the case may decrease depending on the temperature of the substrate or the temperature of the atmosphere between the case and the temperature sensor.

Patent Document 1 describes an electronic device including a land pattern on a substrate on which a temperature sensor is mounted. The heat from the case is transferred to the land pattern. The land pattern extends to the vicinity of the temperature sensor.

It is desired that the accuracy of measuring the temperature of the case be further improved.

PRIOR ART DOCUMENTS

Patent Documents

Patent Document 1: Japanese Laid-Open Patent Publication No. 2008-196936

SUMMARY OF THE INVENTION

Problems that the Invention is to Solve

It is an objective of the present invention to provide an electronic device capable of improving the accuracy of measuring the temperature of a case using a temperature sensor.

Means for Solving the Problem

To solve the above-described problem, a first aspect of the present invention provides an electronic device including: a case that is cooled by a cooling medium; a substrate mounted on the case, the substrate including a land pattern that is in contact with the case; and a temperature sensor mounted on a surface of the substrate, the temperature sensor measuring a temperature of the case. The case includes: a bottom wall; a side wall on an edge of the bottom wall; a boss on the bottom wall, the boss supporting the substrate; and a coupling portion that couples the side wall to the boss and extends from the bottom wall toward the substrate. The boss includes a support surface that supports the substrate. The coupling portion includes an opposing surface that faces the temperature sensor at a position that is lower than a height from the bottom wall to the support surface.

MODES FOR CARRYING OUT THE INVENTION

An electronic device according to an embodiment will now be described.

Figure 1:
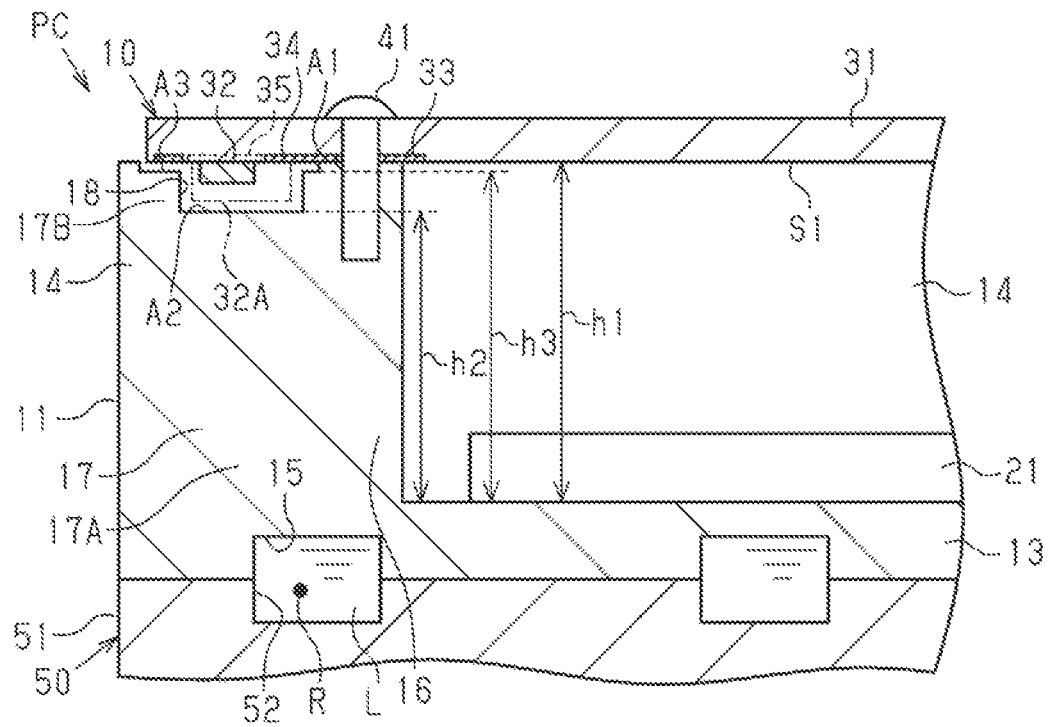
FIG. 1 is a cross-sectional view, with a part cut away, showing a DC/DC converter.
Figure 2:
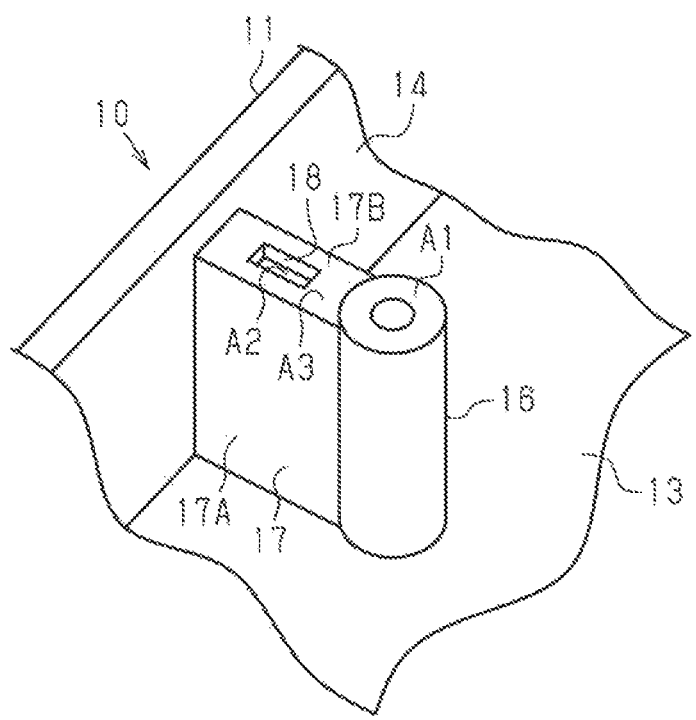
FIG. 2 is a perspective view, with a part cut away, showing a part of the case.

As shown in FIGS. 1 and 2, a power conversion device PC includes a DC/DC converter 10, which serves as an electronic device, and an inverter 50. The power conversion device PC is, for example, a power control unit installed in a vehicle. The power conversion device PC transforms a power supply voltage and converts direct-current power into alternating-current power to supply the converted power to a motor.

The DC/DC converter 10 includes a metal case 11, a power converter 21 that is accommodated in the case 11, a substrate 31, a temperature sensor 32 that is mounted on the surface of the substrate 31, and a screw 41 that is used to fix the substrate 31 to the case 11. The power converter 21 is, for example, a power board on which a switching element and a transformer are mounted.

The case 11 includes a plate-shaped bottom wall 13, side walls 14 that extend from the bottom wall 13, a boss 16, and a coupling portion 17. The bottom wall 13 includes a partition 15 that is provided to define a cooling passage R. The partition 15 is a recess in the surface of the case 11. The partition 15 is opened toward the outside of the case 11. The inverter 50 including an inverter case 51 is fixed to the bottom wall 13 of the case 11. More specifically, the inverter 50 is fixed to the case 11 such that the inverter case 51 closes the partition 15. The closing of the partition 15 by the inverter case 51 defines the cooling passage R between the case 11 and the inverter case 51. The inverter case 51 includes a partition 52 at a position facing the partition 15. The partition 52 and the partition 15 define the cooling passage R. The inverter case 51 does not have to include the partition 52.

The cooling passage R is a circulation passage through which a coolant medium L flows. The coolant medium L is a liquefied refrigerant such as antifreeze. The coolant medium L is circulated in the cooling passage R by an apparatus (such as a pump) that discharges the coolant medium L. The circulation of the coolant medium L in the cooling passage R cools the case 11, thereby cooling a heating element such as the power converter 21, which is accommodated in the case 11.

The side walls 14 are arranged on the edge of the bottom wall 13. In the present embodiment, the side walls 14 extend in the thickness direction of the bottom wall 13 from one of the two surfaces of the bottom wall 13 in the thickness direction. That is, the case 11 has a closed end and is tubular.

The boss 16 is a columnar member extending from the bottom wall 13 in the thickness direction of the bottom wall 13. The boss 16 includes a support surface A1 that supports the substrate 31. The substrate 31 is fixed to the case 11 by fastening, to the boss 16, the screw 41 that has been inserted through the substrate 31. In the present embodiment, the substrate 31 is fixed to the open end of the case 11.

The coupling portion 17 couples the side wall 14 and the boss 16 to each other. The coupling portion 17 extends in the thickness direction of the bottom wall 13. That is, the coupling portion 17 extends from the bottom wall 13 toward the substrate 31. The coupling portion 17 is lower than the boss 16 in terms of the height from the bottom wall 13. Thus, the coupling portion 17 is not in contact with the substrate 31, which is supported by the boss 16.

The coupling portion 17 includes a base 17A and a peripheral wall portion 17B. The base 17A extends from the bottom wall 13. The peripheral wall portion 17B extends from the base 17A toward the substrate 31. The peripheral wall portion 17B is tubular. The coupling portion 17 includes an opposing surface A2. The opposing surface A2 is an end surface of the base 17A that is opposite to the bottom wall 13. The opposing surface A2 is surrounded by the peripheral wall portion 17B. The peripheral wall portion 17B extends from a region surrounding the opposing surface A2 toward the substrate 31. The region surrounded by the peripheral wall portion 17B defines a recess 18. The bottom of the recess 18 is the opposing surface A2.

The peripheral wall portion 17B includes an end surface A3 that faces the substrate 31. The end surface A3 is an end surface of the peripheral wall portion 17B, which is opposite to the base 17A.

Height h1 from the bottom wall 13 to the support surface A1 is greater than height h2 from the bottom wall 13 to the opposing surface A2. Height h3 from the bottom wall 13 to the end surface A3 is less than height h1 from the bottom wall 13 to the support surface A1 and is greater than height h2 from the bottom wall 13 to the opposing surface A2. Thus, the end surface A3 faces the substrate 31 at a position that is lower than height h1 from the bottom wall 13 to the support surface A1 and is higher than height h2 from the bottom wall 13 to the opposing surface A2.

The substrate 31 is, for example, a printed board of a glass epoxy substrate. The substrate 31 is a control board used to control the DC/DC converter 10, such as a switching element of the power converter 21. The temperature sensor 32 is mounted on the surface of the substrate 31. The temperature sensor 32 may be any temperature sensor, such as a thermistor or a thermocouple. The temperature sensor 32 measures the temperature of the case 11.

Figure 3:
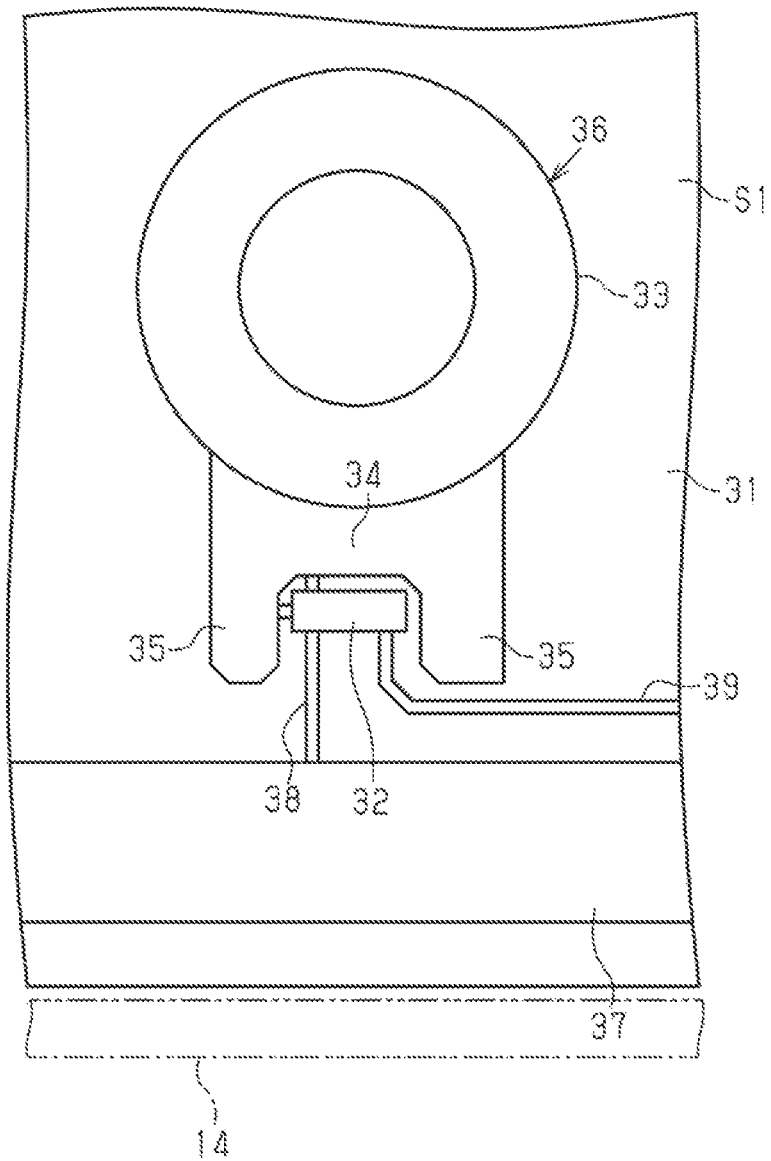
FIG. 3 is a plan view, with a part cut away, showing the substrate.

As shown in FIG. 3, the substrate 31 includes a land pattern 36, a ground pattern 37, a pattern 38, and a signal pattern 39. The ground pattern 37 is arranged along the periphery of the substrate 31. The pattern 38 connects the temperature sensor 32 and the ground pattern 37 to each other. The signal pattern 39 connects the temperature sensor 32 and a controller (not shown) to each other. The land pattern 36, the ground pattern 37, the pattern 38, and the signal pattern 39 are arranged on the same surface S1 of the substrate 31.

The land pattern 36 is in contact with the case 11 and receives the heat of the case 11. The land pattern 36 includes an annular contact portion 33, a first heat transfer portion 34, and two second heat transfer portions 35. The first heat transfer portion 34 is arranged between the contact portion 33 and the temperature sensor 32. The two second heat transfer portions 35 extend from the first heat transfer portion 34. The two second heat transfer portions 35 are spaced apart from each other and extend from the first heat transfer portion 34 in the same direction. That is, the first heat transfer portion 34 and the two second heat transfer portions 35 have a U-shape. The contact portion 33 is in contact with the boss 16. The heat of the case 11 is transferred to the contact portion 33 through the boss 16.

The first heat transfer portion 34 extends along the long sides of the temperature sensor 32. The two second heat transfer portions 35 extend in the same direction from the first heat transfer portion 34. The two second heat transfer portions 35 extend from the first heat transfer portion 34 toward the ground pattern 37. The temperature sensor 32 is arranged between the two second heat transfer portions 35. That is, the first heat transfer portion 34 and the two second heat transfer portions 35 are arranged along the long sides and the short sides of the temperature sensor 32, respectively. A gap is opened between the two second heat transfer portions 35 in the direction extending along the surface S1 of the substrate 31. In the present embodiment, the gap between the two second heat transfer portions 35 is opened toward the ground pattern 37. The heat of the case 11 is transferred from the contact portion 33 to the first heat transfer portion 34 and the second heat transfer portion 35.

The signal pattern 39 is connected to the controller through a section between the ground pattern 37 and one of the two second heat transfer portions 35. The controller recognizes a measurement value of the temperature sensor 32 from a signal sent from the signal pattern 39.

As shown in FIG. 1, the substrate 31 is supported by the boss 16 such that the surface S1 faces the bottom wall 13. The temperature sensor 32 is arranged so as to face the opposing surface A2. The opposing surface A2 faces the temperature sensor 32 at a position that is lower than height h1 from the bottom wall 13 to the support surface A1. The peripheral wall portion 17B is located so as to avoid the temperature sensor 32 and extends from the region surrounding the opposing surface A2 toward the substrate 31. The recess 18 is arranged at a position separated from the temperature sensor 32.

As shown in FIGS. 1 and 3, each second heat transfer portion 35 extends toward one of the side walls 14 that is closest to the first heat transfer portion 34. That is, the gap between the two second heat transfer portions 35 is opened toward the one of the side walls 14 closest to the first heat transfer portion 34. The boss 16 and the screw 41 are located between the temperature sensor 32 and the center of the case 11. The boss 16 and the screw 41 are located between the temperature sensor 32 and the power converter 21.

The operation of the present embodiment will now be described.

When the DC/DC converter 10 is used, the power converter 21 generates heat so that the coolant medium L circulates through the cooling passage R, thereby cooling the power converter 21. The temperature of the coolant medium L rises through heat exchange of the coolant medium L and the case 11.

The temperature of the coolant medium L and the temperature of the case 11 correlate with each other. The controller indirectly monitors the temperature of the coolant medium L from the temperature of the case 11 that has been measured by the temperature sensor 32. Since the temperature sensor 32 faces the opposing surface A2, the heat from the coupling portion 17 is easily transferred to the temperature sensor 32. That is, as compared with when the temperature sensor 32 faces the bottom wall 13, the distance from the temperature sensor 32 to the case 11 is short and therefore the ambient temperature in the region surrounding the temperature sensor 32 approaches the temperature of the case 11.

The peripheral wall portion 17B is arranged so as to avoid the temperature sensor 32. Thus, the opposing surface A2 is farther away from the substrate 31 than the end surface A3. Various types of the temperature sensor 32 are used according to the performance of the DC/DC converter 10 and the measurement accuracy required for the temperature sensor 32. As the type of the temperature sensor 32 changes, the size of the temperature sensor 32 may change.

For example, in one configuration, as shown in FIG. 1, a temperature sensor 32A may be used. The temperature sensor 32A is larger than the temperature sensor 32 of the present embodiment in the dimension of the thickness direction of the substrate 31 and the dimension of the direction corresponding to the surface of the substrate 31. Even in such a case, the peripheral wall portion 17B is arranged so as to avoid the temperature sensor 32. Thus, the temperature sensor 32A and the coupling portion 17 are prevented from contacting each other. The height from the bottom wall 13 to the opposing surface A2 and the opening area of the peripheral wall portion 17B are defined by, for example, the size of the temperature sensor 32 mounted on the surface of the substrate 31 and defined such that the largest temperature sensor 32 does not contact the coupling portion 17.

In one configuration, the peripheral wall portion 17B may not be included. However, in such a case, the entire coupling portion 17 is separated from the temperature sensor 32. Thus, the arrangement of the peripheral wall portion 17B prevents the temperature sensor 32 and the coupling portion 17 from contacting each other and allows part of the coupling portion 17 to approach the temperature sensor 32. This prevents the temperature sensor 32 and the coupling portion 17 from interfering with each other and allows the ambient temperature in the region surrounding the temperature sensor 32 to approach the temperature of the case 11.

Further, the heat transfer portions 34, 35 are arranged around the temperature sensor 32. The heat transfer portions 34, 35 receive the heat from the case 11. The heat transferred from the heat transfer portions 34, 35 causes the ambient temperature in the region surrounding the temperature sensor 32 to approach the temperature of the case 11.

The gap between the two second heat transfer portions 35 is opened toward one of the side walls 14 closest to the first heat transfer portion 34. That is, the gap between the second heat transfer portions 35 is not opened toward the center of the case 11 (i.e., is not opened toward the power converter 21 serving as a heating element). If the opening between the two second heat transfer portions 35 faces the power converter 21, the temperature sensor 32 is easily affected by the heat from the power converter 21. Thus, the opening of the gap between the two second heat transfer portions 35 toward the side wall 14 makes the temperature sensor 32 less affected by the heat from the inside of the case 11.

The temperature of the case 11 measured by the temperature sensor 32 is sent to the controller. When the temperature of the case 11 has increased excessively, the controller determines that the temperature of the coolant medium L has increased excessively and then limits the output of the DC/DC converter 10 or stops the DC/DC converter 10.

In one configuration, the temperature sensor 32 may be arranged on a dedicated boss that is on the case 11, instead of being arranged on the surface of the substrate 31. In this case, the case 11 needs to have a dedicated boss and the substrate 31 and a temperature sensor need to be connected to each other using a lead. This increases the area on the case 11 needed for the arrangement of the temperature sensor 32 and increases manufacturing costs. In contrast, the size of the DC/DC converter 10 and the manufacturing costs can be reduced by mounting the temperature sensor 32 on the surface of the substrate 31 and measuring the temperature of the case 11 using the temperature sensor 32.

The advantages of the embodiment will now be described.

(1) The opposing surface A2 faces the temperature sensor 32 mounted on the surface of the substrate 31. Thus, the ambient temperature in the region surrounding the temperature sensor 32 approaches the temperature of the case 11. This improves the accuracy of measuring the temperature of the case 11 using the temperature sensor 32.

(2) The peripheral wall portion 17B is arranged so as to avoid the temperature sensor 32. In this structure, as compared with a structure without the recess 18, the opposing surface A2 is easily separated from the temperature sensor 32. Thus, even if a temperature sensor that differs in size from the temperature sensor 32 is used, the temperature sensor 32 and the coupling portion 17 are prevented from contacting each other. Accordingly, multiple types of the temperature sensor 32 can be used for a wide variety of purposes.

(3) The arrangement of the heat transfer portions 34, 35 along the sides of the temperature sensor 32 causes the ambient temperature in the region surrounding the temperature sensor 32 to approach the temperature of the case 11. This further improves the accuracy of measuring the temperature of the case 11 using the temperature sensor 32.

(4) The gap between the two second heat transfer portions 35 is opened toward one of the side walls 14 closest to the first heat transfer portion 34. If the gap between the two second heat transfer portions 35 is opened toward the center of the case 11, the heat generated by the power converter 21 is easily transferred to the temperature sensor 32. This may lower the accuracy of measuring the temperature of the case 11. Thus, the opening of the gap between the two second heat transfer portions 35 toward the one of the side walls 14 closest to the first heat transfer portion 34 makes the temperature sensor 32 less affected by the heat generated by the power converter 21, which is accommodated in the case 11.

Further, the first heat transfer portion 34 is arranged between the temperature sensor 32 and the power converter 21. In this case, when the first heat transfer portion 34 functions as a shield, the temperature sensor 32 is prevented from receiving noise from the power converter 21.

(5) The gap between the two second heat transfer portions 35 is opened toward the ground pattern 37. This allows the ground pattern 37 to function as a shield, thereby preventing the temperature sensor 32 from receiving external noise.

(6) The screw 41 used to fix the substrate 31 to the case 11 is located between the temperature sensor 32 and the power converter 21. This allows the screw 41 to prevent the temperature sensor 32 from receiving the heat from the power converter 21.

The present embodiment may be modified as follows. The present embodiment and the following modifications can be combined as long as the combined modifications remain technically consistent with each other.

The gap between the two second heat transfer portions 35 may be opened toward a member other than the ground pattern 37. For example, the gap between the second heat transfer portions 35 may be opened toward the power converter 21.

The gap between the two second heat transfer portions 35 may be opened toward a side wall 14 that differs from the side wall 14 closest to the first heat transfer portion 34.

The shape of the land pattern 36 may be changed. For example, the land pattern 36 may include only the contact portion 33. Alternatively, the first heat transfer portion 34 or the second heat transfer portions 35 may be omitted from the land pattern 36. That is, the land pattern 36 may have any shape as long as the land pattern 36 is in contact with the case 11 and close to the temperature sensor 32 so that the ambient temperature of the temperature sensor 32 approaches the temperature of the case 11.

The coupling portion 17 does not have to include the peripheral wall portion 17B.

The DC/DC converter 10 may include an accommodation body that surrounds the temperature sensor 32. The accommodation body is, for example, an aluminum sensor case fixed to the substrate 31. Surrounding the temperature sensor 32 with the accommodation body prevents the inside of the accommodation body from being affected by external temperature. That is, the heat transferred from the land pattern 36 allows the temperature in the accommodation body to approach the temperature of the case 11 and thus improves the accuracy of measuring the temperature of the case 11. When the accommodation body is provided, the temperature sensor 32 does not have to face the coupling portion 17. That is, since the temperature sensor 32 can be arranged at any position on the substrate 31, there are fewer limits on the location of the temperature sensor 32.

The electronic device may be any device that cools the case 11 using the coolant medium L.

The land pattern 36 may be in contact with the case 11 at a portion other than the boss 16. For example, the land pattern 36 may be in contact with the side walls 14 of the case 11.

In the embodiment, the cooling passage R is defined by closing the partition 15 using a member that differs from the electronic device. Instead, the cooling passage R may include only the case 11. That is, a hole in the case 11 may be a cooling passage R instead of the recess 18. Further, the cooling passage R may be arranged outside the case 11 by a member that differs from the case 11.

The invention claimed is:

1. An electronic device, comprising:
   a case that is cooled by a cooling medium;
   a substrate mounted on the case, the substrate including a land pattern that is in contact with the case; and
   a temperature sensor mounted on a surface of the substrate, the temperature sensor measuring a temperature of the case, wherein
   the case includes:
      a bottom wall;
      a side wall on the bottom wall;
      a boss on the bottom wall, the boss supporting the substrate; and
      a coupling portion that couples the side wall to the boss and extends from the bottom wall toward the substrate,
   the boss includes a support surface that supports the substrate, and
   the coupling portion includes an opposing surface that faces the temperature sensor at a position that is lower than a height from the bottom wall to the support surface.

2. The electronic device according to claim 1, wherein
   the coupling portion includes a peripheral wall portion located so as to avoid the temperature sensor and extending from a region surrounding the opposing surface toward the substrate, and
   the peripheral wall portion includes an end surface facing the substrate at a position that is lower than the height from the bottom wall to the support surface and is higher than a height from the bottom wall to the opposing surface.

3. The electronic device according to claim 1, wherein the land pattern includes:
   a first heat transfer portion extending along the temperature sensor; and
   second heat transfer portions extending from the first heat transfer portion, wherein the temperature sensor is arranged between the two second heat transfer portions, and
   a gap is opened between the two second heat transfer portions.

4. The electronic device according to claim 3, wherein the side wall is one of side walls, and
   the second heat transfer portions extend toward one of the side walls that is closest to the first heat transfer portion.

5. The electronic device according to claim 3, wherein the second heat transfer portions extend from the first heat transfer portion toward a ground pattern.

* * * * *